(12) United States Patent
Chang et al.

(10) Patent No.: US 11,329,056 B2
(45) Date of Patent: May 10, 2022

(54) SRAM DEVICE AND MANUFACTURING METHOD THEREOF

(71) Applicant: Powerchip Semiconductor Manufacturing Corporation, Hsinchu (TW)

(72) Inventors: Shou-Zen Chang, Taichung (TW); Yi-Hsung Wei, Taoyuan (TW); Jia-You Lin, Hsinchu (TW); Pei-Hsiu Tseng, Tainan (TW); Chih-Peng Lee, Yunlin County (TW); Chi-Wei Lin, New Taipei (TW)

(73) Assignee: Powerchip Semiconductor Manufacturing Corporation, Hsinchu (TW)

( * ) Notice: Subject to any disclaimer, the term of this patent is extended or adjusted under 35 U.S.C. 154(b) by 43 days.

(21) Appl. No.: 16/931,411

(22) Filed: Jul. 16, 2020

(65) Prior Publication Data
US 2021/0327884 A1    Oct. 21, 2021

(30) Foreign Application Priority Data
Apr. 21, 2020    (TW) .................................. 109113251

(51) Int. Cl.
*H01L 27/11*    (2006.01)
*H01L 23/522*    (2006.01)
(Continued)

(52) U.S. Cl.
CPC .... *H01L 27/1116* (2013.01); *H01L 21/76807* (2013.01); *H01L 21/76843* (2013.01);
(Continued)

(58) Field of Classification Search
CPC ............. H01L 27/1104; H01L 27/1116; H01L 27/0207; H01L 27/11; H01L 21/823871; H01L 21/823842; H01L 25/0657
See application file for complete search history.

(56) References Cited

U.S. PATENT DOCUMENTS 7,889,541 B2    2/2011    Shih et al.
9,899,389 B2 *  2/2018    Luan ...................... G11C 11/41
(Continued)

FOREIGN PATENT DOCUMENTS

TW    201913128    4/2019
TW    202006889    2/2020

OTHER PUBLICATIONS

"Office Action of Taiwan Counterpart Application", dated Sep. 30, 2021, p. 1-p. 5.

*Primary Examiner* — Jaehwan Oh
*Assistant Examiner* — John M Parker
(74) *Attorney, Agent, or Firm* — JCIPRNET (57) ABSTRACT

A SRAM device includes a substrate, at least one two-transistor static random access memory (2T-SRAM), an inner dielectric layer, a plurality of contacts, an inter-layer dielectric (ILD) layer, a plurality of vias, and a conductive line. The 2T-SRAM is disposed on the substrate, the inner dielectric layer covers the 2T-SRAM, and the contacts are disposed in the inner dielectric layer and coupled to the 2T-SRAM. The ILD layer covers the inner dielectric layer and the contacts, and the vias are disposed in the ILD layer and respectively coupled to the 2T-SRAM trough the corresponding contacts. The conductive line is disposed on the ILD layer and connects with the plurality of vias, wherein the thickness of the conductive line is less than or equal to one-tenth of the thickness of the via such that it can significantly reduce the coupling effect compared with the traditional bit line.

17 Claims, 8 Drawing Sheets

(51) Int. Cl.
   *H01L 23/528*   (2006.01)
   *H01L 21/8234*  (2006.01)
   *H01L 21/768*   (2006.01)
   *H01L 49/02*    (2006.01)

(52) U.S. Cl.
   CPC ............. *H01L 21/76877* (2013.01); *H01L 21/823475* (2013.01); *H01L 23/5226* (2013.01); *H01L 23/5283* (2013.01); *H01L 28/40* (2013.01)

(56) References Cited

U.S. PATENT DOCUMENTS

| | | | |
|---|---|---|---|
| 10,020,311 B1* | 7/2018 | Li | H01L 27/10817 |
| 10,510,600 B1* | 12/2019 | Hsu | H01L 21/0275 |
| 10,825,508 B1* | 11/2020 | Tseng | H01L 27/1104 |
| 2007/0063286 A1* | 3/2007 | Kotani | H01L 27/11 257/365 |
| 2012/0187504 A1* | 7/2012 | Igarashi | H01L 21/76895 257/390 |
| 2012/0193601 A1* | 8/2012 | Tsukamoto | H01L 27/228 257/5 |
| 2013/0175578 A1* | 7/2013 | Lee | H01L 27/088 257/192 |
| 2018/0286957 A1* | 10/2018 | Bae | H01L 29/66795 |
| 2019/0067300 A1* | 2/2019 | Chiu | G11C 29/04 |
| 2021/0257470 A1* | 8/2021 | Bae | H01L 29/785 |

* cited by examiner

SRAM DEVICE AND MANUFACTURING METHOD THEREOF

CROSS-REFERENCE TO RELATED APPLICATION

This application claims the priority benefit of Taiwan application serial no. 109113251, filed on Apr. 21, 2020. The entirety of the above-mentioned patent application is hereby incorporated by reference herein and made a part of this specification.

BACKGROUND

1. Technical Field

The disclosure relates to a memory device, and more particularly, to an SRAM device and a manufacturing method thereof.

2. Description of Related Art

The static random access memory (SRAM) is a volatile semiconductor memory device. At present, a memory device coupled by two transistors and a capacitor has been developed. In this kind of memory device, the capacitor is employed as a storage element.

Notably, the metal layer thickness of the back end of line (BEOL) of the related art is significantly thicker than the size of the memory device, and therefore there is a high capacitance between the two metal layers, which results in a serious coupling effect. The coupling effect is particularly severe in the part of the bit line close to the memory device. Since interferences caused by the coupling effect grow with the capacitance in the SRAM, these interferences no longer can be ignored.

SUMMARY

The disclosure provides a static random access memory (SRAM) device capable of significantly reducing the coupling effect.

The disclosure further provides a method for manufacturing a SRAM device, which consists of the existing manufacturing processes, and does not include cumbersome steps. As such, the SRAM memory manufactured accordingly is robust to interferences.

An SRAM device of the disclosure includes a substrate, at least one two-transistor static random access memory (2T-SRAM), an inner dielectric layer, multiple contacts, a first inter-layer dielectric (ILD) layer, multiple first vias and a conductive line. The substrate includes a 2T-SRAM region and a peripheral circuit region. The 2T-SRAM is disposed on the substrate, the inner dielectric layer covers the 2T-SRAM, and the contacts are disposed in the inner dielectric layer and coupled to the 2T-SRAM. The first ILD layer covers the inner dielectric layer and the contacts, and the first vias are disposed in the first ILD layer and respectively coupled to the 2T-SRAM trough the corresponding contacts. The conductive line is disposed on the first ILD layer and connects the first vias, wherein a thickness of the conductive line is less than or equal to one-tenth of a thickness of the first vias.

According to an embodiment of the disclosure, the SRAM device can further include a second ILD layer covering the conductive line, and include at least one a second via or dual damascene structure disposed in the second ILD layer and connected to the conductive line.

According to an embodiment of the disclosure, the SRAM device can further include at least one peripheral device disposed on the substrate of the peripheral circuit region.

According to an embodiment of the disclosure, the SRAM device can further include multiple third vias, disposed in the first ILD layer of the peripheral circuit region and coupled to the peripheral device, wherein the third vias and the first vias are formed by materials from the same layer.

According to an embodiment of the disclosure, the SRAM device can further include a fourth via, disposed in the second ILD layer of the peripheral circuit region and coupled to the third vias, wherein the fourth via and the second via are formed by materials from the same layer.

According to an embodiment of the disclosure, the dual damascene structure can further extend to the peripheral circuit region and be coupled to the third vias.

A method of the disclosure for manufacturing a SRAM device includes providing a substrate having a 2T-SRAM region and a peripheral circuit region; forming at least one 2T-SRAM on the 2T-SRAM region; forming an inner dielectric layer on the substrate covering the 2T-SRAM; forming multiple contacts in the inner dielectric layer, wherein the contacts are coupled to the 2T-SRAM; forming a first ILD layer on the substrate, wherein the first ILD layer covers the inner dielectric layer and the contacts; forming multiple first vias in the first ILD layer, wherein each of the first vias is coupled to the 2T-SRAM through the corresponding contact; and forming a conductive line on the first ILD layer, wherein the conductive line connects the first vias, wherein a thickness of the conductive line is less than or equal to one-tenth of a thickness of the first vias.

According to an alternative embodiment of the disclosure, the step of forming the conductive line includes: forming a conductive layer on the first ILD layer, wherein the conductive layer covers the first ILD layer and the first vias; forming a patterned photoresist layer on the conductive layer; and etching a part of the conductive layer outside the 2T-SRAM region by employing the patterned photoresist layer as a mask, to form the conductive line.

According to an alternative embodiment of the disclosure, after the step of forming the conductive line, the method can further include: forming a second ILD layer on the substrate to cover the conductive line; and forming at least one second via or at least one dual damascene structure in the second ILD layer, wherein the at least one second via or the at least one dual damascene structure is connected to the conductive line.

According to an alternative embodiment of the disclosure, before the step of forming the inner dielectric layer, the method can further include forming at least one peripheral device in the peripheral circuit region.

According to an alternative embodiment of the disclosure, multiple third vias coupled to the peripheral device can be formed in the peripheral circuit region while forming the first vias.

According to an alternative embodiment of the disclosure, a fourth via coupled to the thirds vias can be formed in the peripheral circuit region while forming the second via.

According to an alternative embodiment of the disclosure, the step of forming the dual damascene structure includes coupling the dual damascene structure to the third vias in the peripheral circuit region.

According to embodiments of the disclosure, material of the conductive line includes tungsten, aluminum, tantalum, tantalum nitride, or a combination of the foregoing.

According to embodiments of the disclosure, the first ILD layer includes a single-layer structure or a multi-layer structure.

According to embodiments of the disclosure, the second ILD layer includes a single-layer structure or a multi-layer structure.

Based upon the above, according to the disclosure, a thinner conductive line is employed to replace the conventional bit line, such that the coupling effect caused by the bit line can be significantly reduced. As a result, the 2T-SRAM can be enhanced to be robust to undesired interferences. Moreover, the conductive line of the disclosure can be formed according to a barrier layer method of the copper manufacturing processes. As such, the thickness of the conductive line can be controlled to achieve an extremely thin level. In comparison with the related art, merely an additional mask process is required to cut off the connection with the peripheral circuit region. In other words, the coupling effect of devices can be reduced without employing cumbersome processes.

To make the aforementioned more comprehensible, several embodiments accompanied with drawings are described in detail as follows.

DESCRIPTION OF THE EMBODIMENTS

The embodiments are described in detail below with reference to the accompanying drawings, but the embodiments are not intended to limit the scope of the present disclosure. In addition, the drawings are for illustrative purposes only and are not drawn to the original dimensions. For the sake of easy understanding, the same elements in the following description will be denoted by the same reference numerals. Moreover, the terms mentioned in the text, such as "comprising", "including" and "having" are all open-ended terms, i.e., meaning "including but not limited to". Furthermore, the directional terms mentioned in the text, such as "on" and "under", are merely used to refer to the drawings. Therefore, the directional terms are for illustration, and are not intended to limit the disclosure.

Figure 1:
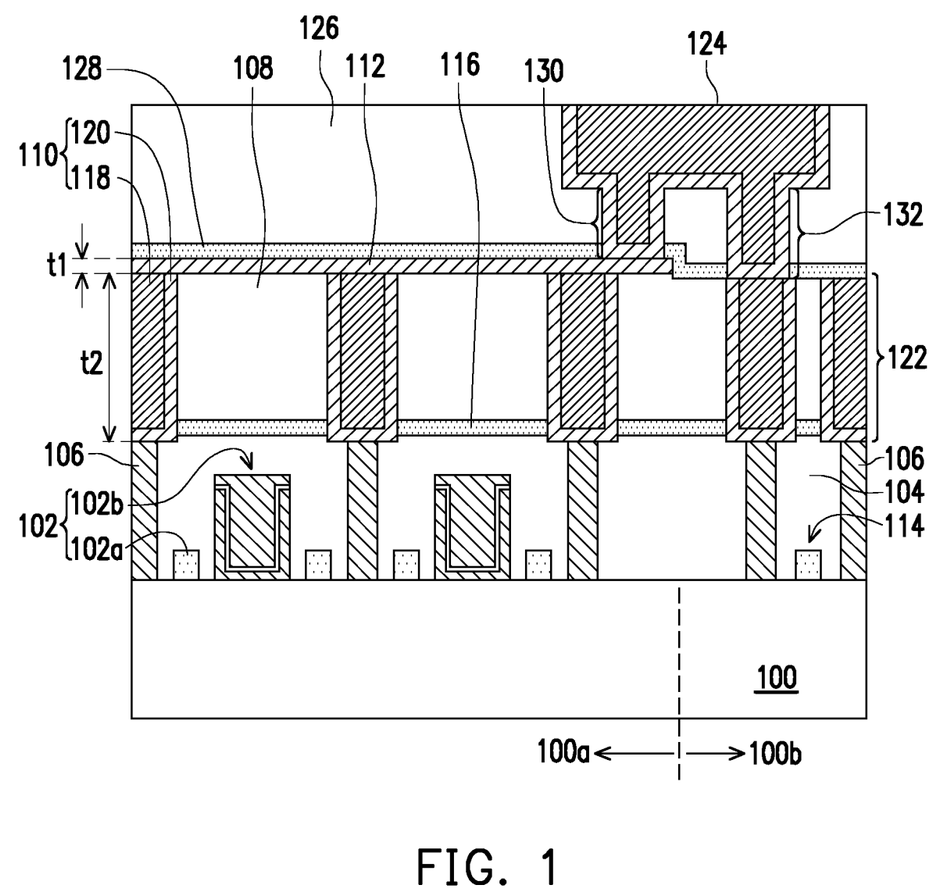
FIG. 1 is a schematic cross-sectional view illustrating a static random access memory (SRAM) device according to a first embodiment of the disclosure.

FIG. 1 is a schematic cross-sectional view illustrating a static random access memory (SRAM) device according to a first embodiment of the disclosure.

Please refer to FIG. 1, in which the SRAM device of the first embodiment includes a substrate 100, at least one two-transistor static random access memory (2T-SRAM) 102, an inner dielectric layer 104, multiple contacts 106, a first inter-layer dielectric (ILD) layer 108, multiple first vias 110 and a conductive line 112. The substrate 100 includes a 2T-SRAM region 100a and a peripheral circuit region 100b. Also, doping regions (such as a well region, LDD region, source region, and drain region, etc.), component isolation structures (such as shallow trench isolation (STI)), and other structures not illustrated are included within the substrate 100. Since the doping regions and the component isolation structures are known to a skilled person in the art, the doping regions and the component isolation structures are not illustrated in the figures, and will not be described herein.

The 2T-SRAM 102 is disposed on the substrate 100 of the 2T-SRAM region 100a. FIG. 1 illustrates two 2T-SRAMs 102, each of which basically includes two transistors 102a and a capacitor 102b, but the disclosure is not limited thereto. In addition, at least one peripheral device 114 (such as a metal oxide semiconductor (MOS) switch) can be disposed on the substrate 100 of the peripheral circuit region 100b. The inner dielectric layer 104 covers the 2T-SRAMs 102, and the contacts 106 are disposed in the inner dielectric layer 104 and respectively coupled to the 2T-SRAMs 102. The material of the inner dielectric layer 104 can be silicon oxide formed by chemical vapor deposition by employing tetraethoxysilane (TEOS) as a reactive gas, or can be selected from borophosphosilicate glass (BPSG), phospho silicate glass (PSG), low dielectric constant (low k) material, etc. In the case that the peripheral device 114 is provided, the contacts 106 can be further disposed in the inner dielectric layer 104 in the peripheral circuit region 100b, and can be coupled to the peripheral device 114.

According to FIG. 1, the first ILD layer 108 covers the inner dielectric layer 104 and the contacts 106. Note that, the first ILD layer 108 can be formed according to a single-layer structure or a multi-layer structure. For example, according to the embodiment of FIG. 1, the first ILD layer 108 is formed according to the single-layer structure. In addition, an interlayer 116 formed by different materials can be disposed between the first ILD layer 108 and the inner dielectric layer 104, so as to facilitate process control. For example, the material of first ILD layer 108 can be $Al_2O_3$ (blue diamond (BD)), and the material of the interlayer 116 can be SiCN, but the disclosure is not limited thereto. The first vias 110 are disposed in the first ILD layer 108 and respectively coupled to the 2T-SRAMs 102 through the corresponding contacts 106. The first vias 110 are, for example, provided with a structure composed of a metal layer 118 and a barrier layer 120. Specifically, the material of the metal layer 118 can be copper, titanium, tungsten or aluminum, and the material of the barrier layer 120 can be tantalum (Ta), titanium (Ti), tantalum nitride (TaN), titanium nitride (TiN), or a combination of the foregoing. In addition, in the case that the peripheral device 114 is provided, third vias 122 can further be provided in the first ILD layer 108 in the peripheral circuit region 100b, so as to couple the peripheral device 114, and the third vias 122 and the first vias 110 can be formed by materials from the same layer. That is, the third vias 122 and the first vias 110 can be formed by the same mask process and the same deposition step while practically manufactured. Note that, although the bottom of the first vias 110 and the bottom of the third vias 122 illustrated in FIG. 1 both extend to the inner dielectric layer 104, the disclosure is not limited thereto, and the bottom of the first vias 110 and the bottom of the third vias 122 can be aligned to the bottom of the interlayer 116.

According to FIG. 1, the conductive line 112 is disposed on the first ILD layer 108 and connects the first vias 110, wherein a thickness t1 of the conductive line 112 is less than or equal to one-tenth of a thickness t2 of the first vias 110 (i.e. $t1 \leq t2/10$). The material of the conductive line 112 can be tungsten, aluminum, tantalum, tantalum nitride, or a combination of the foregoing for forming extremely thin thickness. In an embodiment, if the thickness t2 of the first vias 110 is around 250 nm, the thickness t1 of the conductive line 112 can be provided to be between 5 nm to 25 nm, the disclosure is not limited thereto. Since the extremely thin conductive line 112 is employed to replace the conventional bit line, the coupling effect caused by the bit line can be significantly reduced. As a result, the 2T-SRAMs 102 can be enhanced to be robust to undesired interferences.

According to an embodiment, a dual damascene structure 124 shown in FIG. 1 can be utilized for the subsequent connection of the conductive line 112. The dual damascene structure 124 is formed in a second ILD layer 126 covering the conductive line 112, and includes a metal layer and a barrier layer. The second ILD layer 126 can be formed according to a single-layer structure or a multi-layer structure. For example, according to the embodiment of FIG. 1, the second ILD layer 126 is formed according to the single-layer structure. In addition, an interlayer 128 formed by different materials can be disposed between the second ILD layer 126 and the conductive line 112, so as to facilitate process control. For example, the material of the second ILD layer 126 can be BD, and the material of the interlayer 128 can be SiCN, the disclosure is not limited thereto. The dual damascene structure 124 typically includes vias and conductive trenches. In the case that the dual damascene structure 124 is required to be coupled with the peripheral device 114, the dual damascene structure 124 can further be extended to the peripheral circuit region 100b, directly contacts the conductive line 112 through a via 130, and directly contacts the third via 122 through another via 132. As a result, the 2T-SRAM 102 can be coupled to the peripheral device 114. According to an alternative embodiment, in the case that a previous layer circuit of the first vias 110 is not required to be directly coupled to the peripheral device 114, the dual damascene structure 124 can be replaced by the second via 130 and the fourth via 132, which are isolated from each other. More specifically, the second via 130 is coupled to the conductive line 112, the fourth via 132 is coupled to the third via 122, and the fourth via 132 and the second via 130 can be formed by material from the same layer. That is, the fourth via 132 and the second via 130 can be formed by the same mask process and the same deposition step while practically manufactured.

FIG. 2A to FIG. 2G are schematic diagrams of a manufacturing process of a SRAM device according to a second embodiment of the disclosure.

Figure 2A:
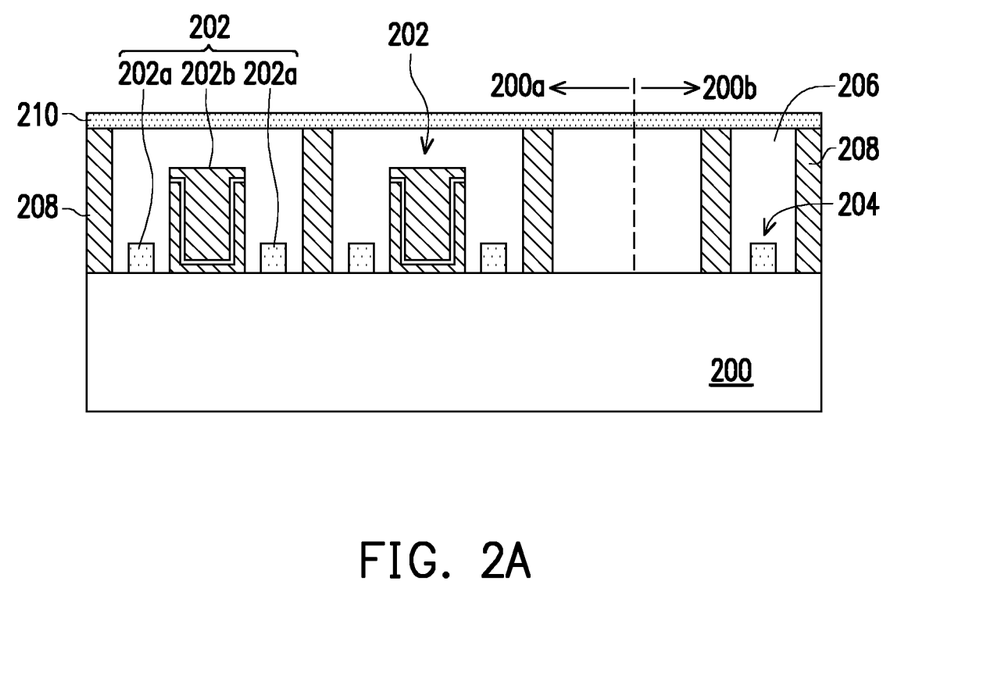
FIG. 2A to FIG. 2G are schematic diagrams of a manufacturing process of a SRAM device according to a second embodiment of the disclosure.

According to FIG. 2A, a substrate 200 is provided to include a 2T-SRAM region 200a and a peripheral circuit region 200b. At least one 2T-SRAM 202 is formed in the 2T-SRAM region 200a. According to the embodiment of FIG. 2A, two 2T-SRAMs 202 are formed, and each of the 2T-SRAMs 202 basically includes two transistors 202a and a capacitor 202b, the disclosure is not limited thereto. In addition, at least one peripheral device 204 (such as a MOS switch) can be disposed on the substrate 200 in the peripheral circuit region 200b. The 2T-SRAMs 202 and the peripheral device 204 can be formed according to the methods in the forming sequence known to a skilled person in the art, which are not further narrated herein. According to an alternative embodiment, the peripheral circuit region 200b and the peripheral device 204 can be formed according to other processes, which are performed separately from the process of the 2T-SRAM region 200a. Next, an inner dielectric layer 206 is formed on the substrate 200 to cover the 2T-SRAM 202 and the peripheral device 204. In addition, multiple contacts 208 are formed in the inner dielectric layer 206 to couple the 2T-SRAMs 202 and the peripheral device 204. Next, an interlayer 210 can be formed on the surfaces of the inner dielectric layer 206 and the contacts 208 to facilitate the control of the subsequent etching process. The material of the interlayer 210 can be referred in the above, and is not further narrated herein.

Figure 2B:
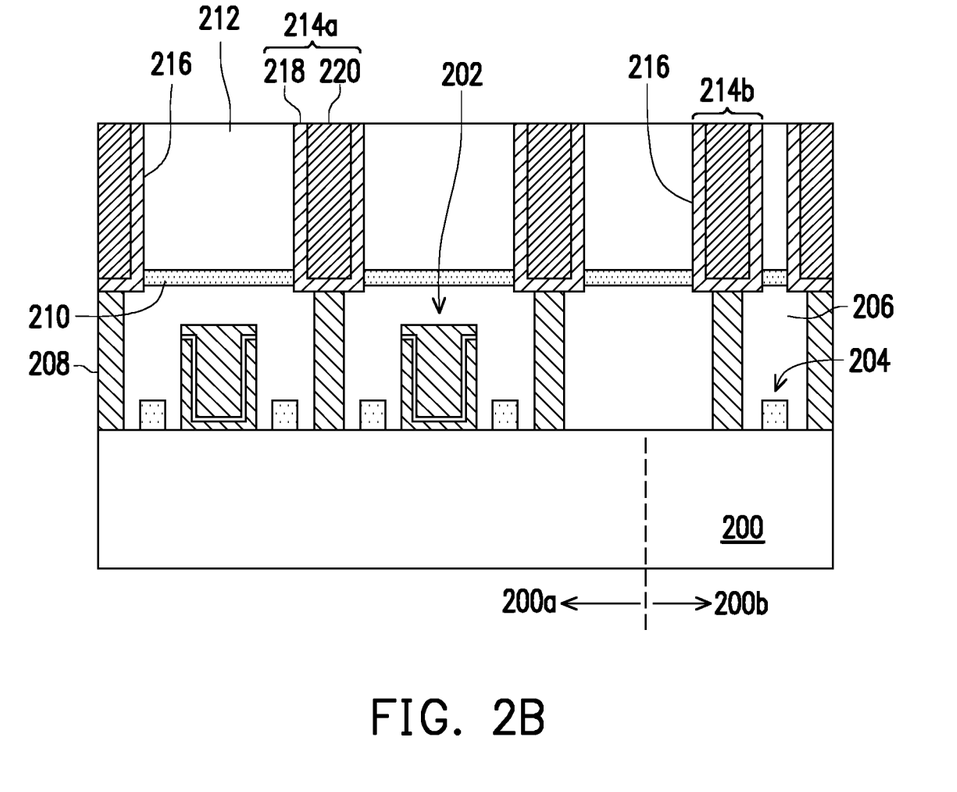

According to FIG. 2B, a first ILD layer 212 is formed on the substrate 200 to cover the interlayer 210 and inner dielectric layer 206 and the contacts 208 thereunder. Note that, the first ILD layer 212 can be formed according to a single-layer structure or a multi-layer structure. Next, multiple first vias 214a are formed in the first ILD layer 212, and each of the first vias 214a is coupled to the 2T-SRAM 202 through the corresponding one of the contacts 208. Note that, multiple third vias 214b coupled to the peripheral device 204 can be formed in the peripheral circuit region 200b while the first vias 214a are formed. According to an embodiment, the step of forming the first vias 214a and the third vias 214b is performed after the step of forming the first ILD layer 212, and includes forming a patterned mask (not shown in FIG. 2B) on the first ILD layer 212, employing the patterned mask as an etching mask, and partially removing the first ILD layer 212 to form multiple openings 216. The openings 216 will pass through the interlayer 210 and expose the contacts 208. Next, a barrier layer 218 can be formed on the surface of the openings 216, and can be filled with a metal 220 (such as copper). Then, a method such as chemical mechanical planarization (CMP) can be employed to planarize the metal 220, but the disclosure is not limited thereto.

Figure 2C:
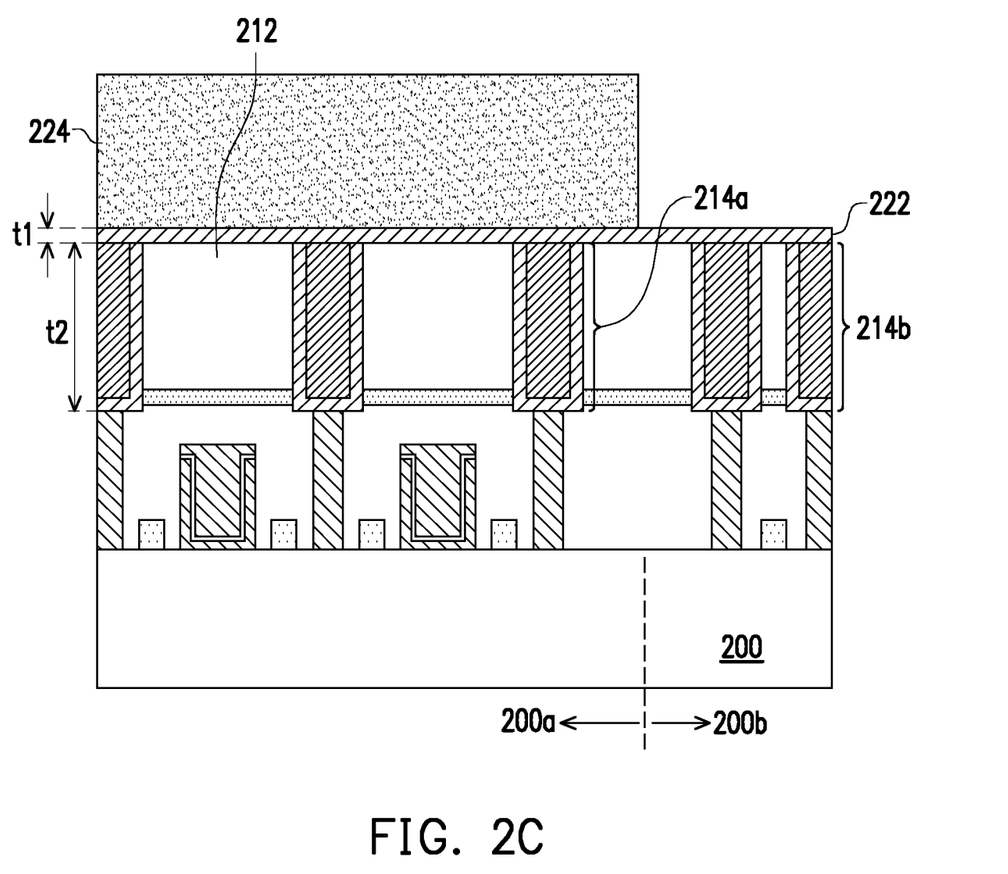

According to FIG. 2C, in order to form a conductive line on the first ILD layer 212, a conductive layer 222 can first be formed on the first ILD layer 212 to cover the first ILD layer 212, the first vias 214a and the third vias 214b. Specifically, a thickness t1 of the conductive layer 222 is less than or equal to one-tenth of a thickness t2 of the first vias 214a, and the material of the conductive layer 222 includes tungsten, aluminum, tantalum, tantalum nitride, or a combination of the foregoing. Next, a pattern photoresist layer 224 is formed on the conductive layer 222 to expose the conductive layer 222 in the peripheral circuit region 200b.

Figure 2D:
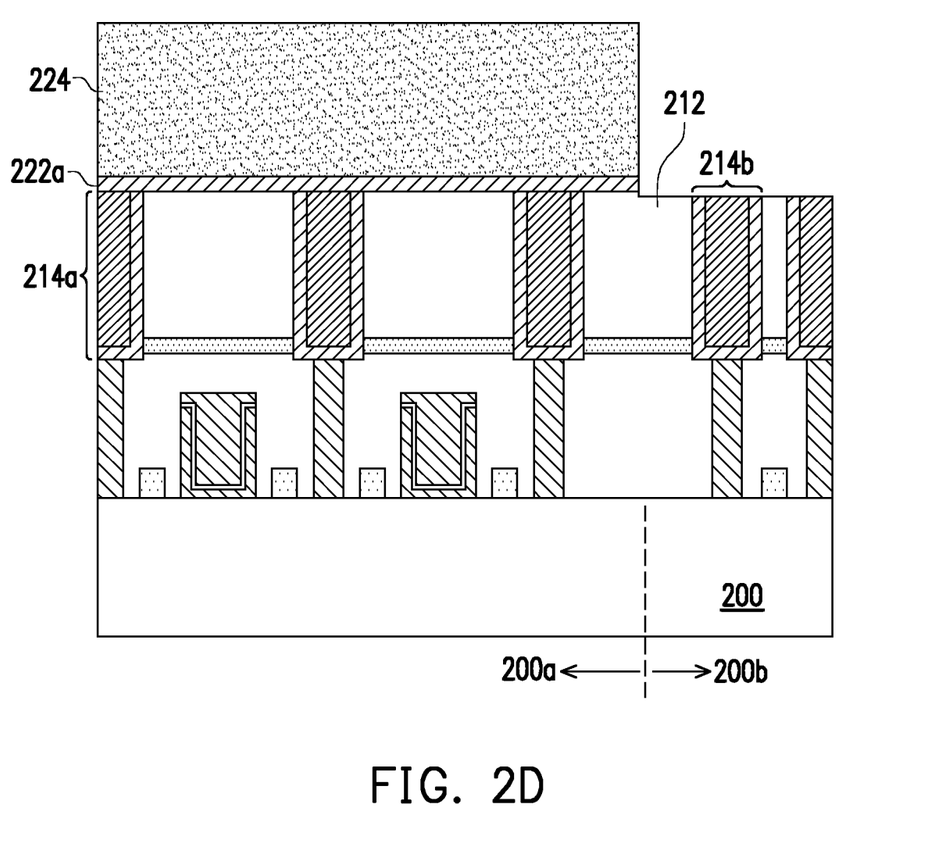

According to the following FIG. 2D, a part of the conductive layer 222 outside the 2T-SRAM region 200a is etched by employing the patterned photoresist layer 224 as a mask, to form the conductive line 222a, which connects the first vias 214a. Once the above etching process is completed, the pattern photoresist layer 224 can be removed.

Figure 2E:
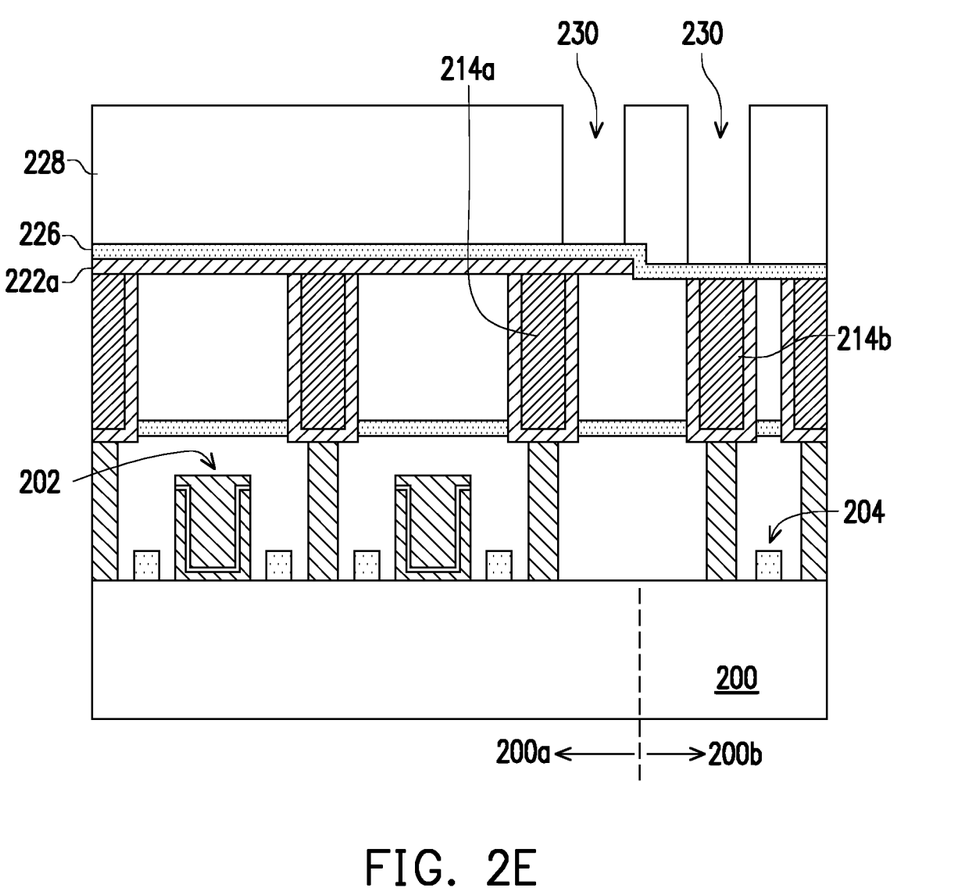

According to the following FIG. 2E, an interlayer 226 can first be formed on the substrate 200, and next a second ILD layer 228 is formed to cover the conductive line 222a, so as to facilitate the control of the subsequent etching process. The material of the interlayer 226 can be referred in the above, and is not further narrated herein. Then, in order to form a dual damascene structure in the second ILD layer 228, via openings 230 can be formed in the second ILD layer 228 by employing a lithography etching process, in which one of the via openings 230 is aligned with the conductive line 222a, and the others of the via openings 230 are aligned with the third via 214b. In addition, if there is no need to directly couple the 2T-SRAM 202 and the peripheral device 204, parts of the interlayer 226 inside the via openings 230 can be removed, and a fourth via (not shown in FIG. 2E) coupled to the third via 214b and a second via (not shown in FIG. 2E) coupled to the conductive line 222a are respectively formed in the via openings 230. The method for implementing the second via and the fourth via can be referred in the above steps regarding the implementation of the first vias 214a and the third vias 214b, and is not further narrated herein.

Figure 2F:
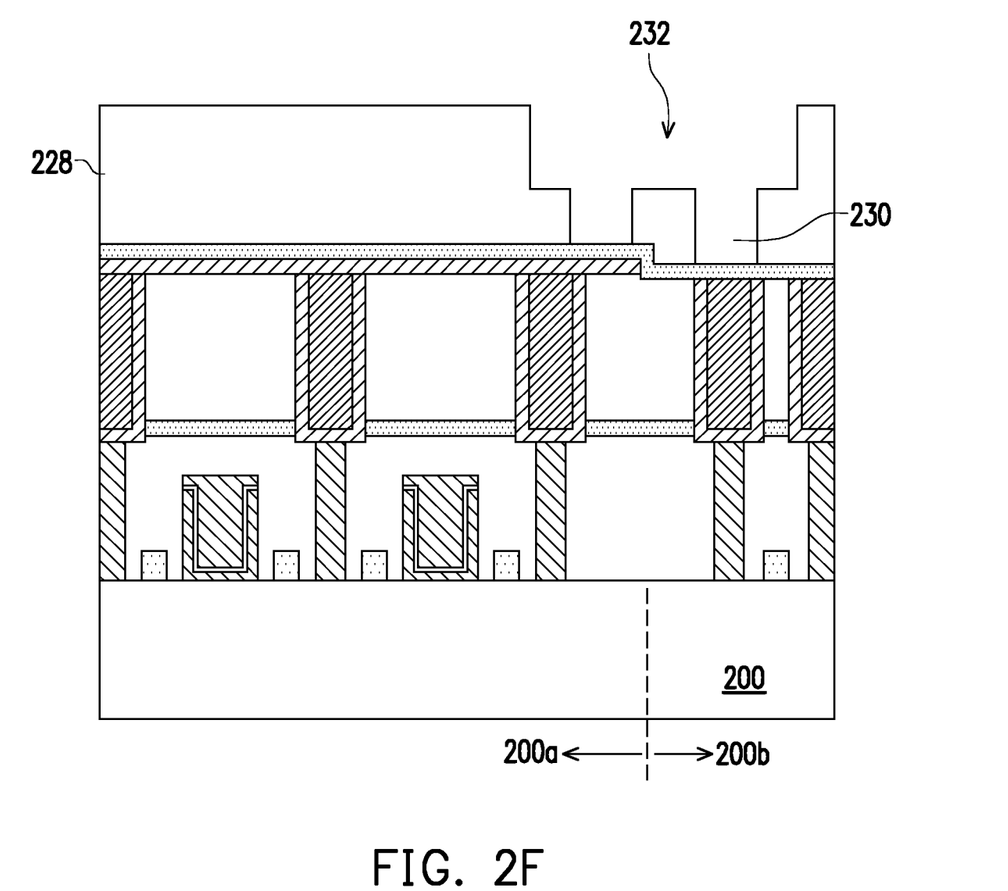

According to the following FIG. 2F, a trench 232 is formed in the second ILD layer 228 by employing a lithography etching process, and is located above the via openings 230. The via openings 230 and the trench 232 can be formed according to the methods in the forming sequence known to a skilled person in the art, which are not further narrated herein.

Figure 2G:
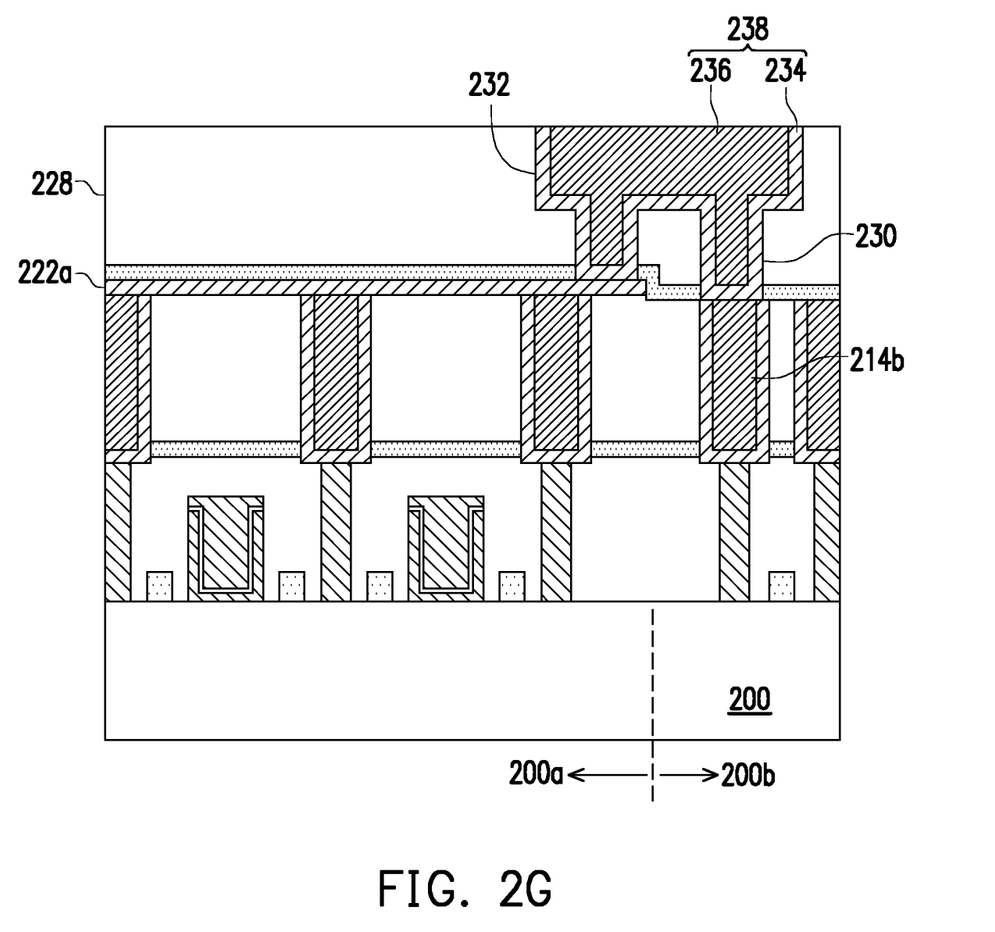

According to FIG. 2G, the parts of the interlayer 226 inside the via openings 230 can first be removed. Next, a barrier layer 234 can be formed on the surfaces of the via openings 230 and the trench 232, and can be filled with a metal layer 236. Next, a method such as the previous mentioned CMP can be employed to planarize the metal layer 236, so as to form a dual damascene structure 238 connecting the conductive line 222a and the third vias 214b, but the disclosure is not limited thereto. Based on practical requirements, the dual damascene structure 238 can be not in contact with the third vias 214b. In such a situation, there is no need to from the via openings 230 above the third vias 214b.

To sum up, according to the disclosure, a conductive line similar to the barrier layer in thickness is employed to replace the conventional bit line, such that the coupling effect caused by the bit line can be significantly reduced, and thereby the 2T-SRAM can be enhanced to be robust to undesired interferences. Since the conductive line of the disclosure can be formed by the barrier layer of the copper manufacturing process, the thickness of the conductive line can be controlled to reach to an extremely thin level. In other words, since the disclosure consists of the existing technology, the coupling effect among components can be reduced without employing cumbersome processes.

Although the present disclosure is described with reference to the above embodiments, the embodiments are not intended to limit the present disclosure. A skilled person in the art may make variations and modifications without departing from the spirit and scope of the present disclosure. Therefore, the protection scope of the present disclosure should be subject to the appended claims.

What is claimed is:

1. A static random access memory (SRAM) device comprising:
    a substrate, having a two-transistor static random access memory (2T-SRAM) region and a peripheral circuit region;
    at least one 2T-SRAM, disposed on the substrate of the 2T-SRAM region;
    an inner dielectric layer, covering the at least one 2T-SRAM;
    a plurality of contacts, disposed in the inner dielectric layer and are coupled to the at least one 2T-SRAM;
    a first inter-layer dielectric (ILD) layer, covering the inner dielectric layer and the plurality of contacts;
    a plurality of first vias, disposed in the first ILD layer and respectively coupled to the at least one 2T-SRAM through the plurality of contacts;
    a conductive line, disposed on the first ILD layer and connecting the plurality of first vias, wherein a thickness of the conductive line is less than or equal to one-tenth of a thickness of the plurality of first vias;
    a second ILD layer, covering the conductive line; and
    at least one second via or at least one dual damascene structure, disposed in the second ILD layer and connected to the conductive line.

2. The SRAM device of claim 1, wherein material of the conductive line comprises tungsten, aluminum, tantalum, tantalum nitride, or a combination of the foregoing.

3. The SRAM device of claim 1, wherein the first ILD layer comprises a single-layer structure or a multi-layer structure.

4. The SRAM device of claim 1 further comprising at least one peripheral device, disposed on the substrate in the peripheral circuit region.

5. The SRAM device of claim 4 further comprising a plurality of third vias, disposed in the first ILD layer of the peripheral circuit region and coupled to the at least one peripheral device, wherein the third vias and the first vias are formed by materials from the same layer.

6. The SRAM device of claim 5 further comprising:
    a fourth via, disposed in the second ILD layer in the peripheral circuit region and coupled to the third vias, wherein the fourth via and the second via are formed by materials from the same layer.

7. The SRAM device of claim 5, wherein the dual damascene structure extends to the peripheral circuit region and is coupled to the third vias.

8. The SRAM device of claim 1, wherein the second ILD layer comprises a single-layer structure or a multi-layer structure.

9. A method for manufacturing a static random access memory (SRAM) device, comprising:
    providing a substrate, having a two-transistor static random access memory (2T-SRAM) region and a peripheral circuit region;
    forming at least one 2T-SRAM on the substrate of the 2T-SRAM region;
    forming an inner dielectric layer on the substrate covering the at least one 2T-SRAM;
    forming a plurality of contacts in the inner dielectric layer, wherein the plurality of contacts are coupled to the at least one 2T-SRAM;
    forming a first inter-layer dielectric (ILD) layer on the substrate, wherein the first ILD layer covers the inner dielectric layer and the plurality of contacts;
    forming a plurality of first vias in the first ILD layer, wherein each of the plurality of first vias is coupled to the at least one 2T-SRAM through the corresponding one of the plurality of contacts;
    forming a conductive line on the first ILD layer, wherein the conductive line connects the plurality of first vias, wherein a thickness of the conductive line is less than or equal to one-tenth of a thickness of the plurality of first vias;
    forming a second ILD layer on the substrate to cover the conductive line; and
    forming at least one second via or at least one dual damascene structure in the second ILD layer, wherein the at least one second via or at least one dual damascene structure is connected to the conductive line.

10. The method of claim 9, wherein the step of forming the conductive line comprises:
    forming a conductive layer on the first ILD layer, wherein the conductive layer covers the first ILD layer and the plurality of first vias;
    forming a patterned photoresist layer on the conductive layer; and
    etching a part of the conductive layer outside the 2T-SRAM region by employing the patterned photoresist layer as a mask, to form the conductive line.

11. The method of claim 9, wherein material of the conductive line comprises tungsten, aluminum, tantalum, tantalum nitride, or a combination of the foregoing.

12. The method of claim 9, wherein the first ILD layer comprises a single-layer structure or a multi-layer structure.

13. The method of claim 9, before the step of forming the inner dielectric layer, further comprising forming at least one peripheral device in the peripheral circuit region.

14. The method of claim 13, wherein a plurality of third vias coupled to the at least one peripheral device are formed in the peripheral circuit region while forming the first vias.

15. The method of claim 14, wherein a fourth via coupled to the thirds vias is formed in the peripheral circuit region while forming the second via.

16. The method of claim 14, wherein the step of forming the dual damascene structure comprises coupling the dual damascene structure to the third vias in the peripheral circuit region.

17. The method of claim 9, wherein the second ILD layer comprises a single-layer structure or a multi-layer structure.

* * * * *